(12) United States Patent
Natta et al.

(10) Patent No.: US 12,501,833 B2
(45) Date of Patent: Dec. 16, 2025

(54) FLEXIBLE PIEZOELECTRIC SENSOR WITH INTEGRATED ELECTROMAGNETIC SHIELD

(71) Applicants: FONDAZIONE ISTITUTO ITALIANO DI TECNOLOGIA, Genoa (IT); FONDAZIONE DON CARLO GNOCCHI ONLUS, Milan (IT)

(72) Inventors: Lara Natta, Galatina (IT); Prospero Lombardi, Milan (IT); Vincenzo Mastronardi, Lequile (IT); Francesco Guido, Lecce (IT); Antonio Qualtieri, Nardo' (IT); Marco Di Rienzo, Milan (IT); Massimo De Vittorio, Lecce (IT)

(73) Assignee: Fondazione Istituto Italiano di Tecnologia, Genoa (IT)

(*) Notice: Subject to any disclaimer, the term of this patent is extended or adjusted under 35 U.S.C. 154(b) by 875 days.

(21) Appl. No.: 17/780,221

(22) PCT Filed: Nov. 26, 2020

(86) PCT No.: PCT/IB2020/061180
§ 371 (c)(1),
(2) Date: May 26, 2022

(87) PCT Pub. No.: WO2021/105920
PCT Pub. Date: Jun. 3, 2021

(65) Prior Publication Data
US 2022/0416148 A1  Dec. 29, 2022

(30) Foreign Application Priority Data
Nov. 27, 2019 (IT) .................. 102019000022278

(51) Int. Cl.
*H10N 30/88* (2023.01)
*H10N 30/30* (2023.01)

(52) U.S. Cl.
CPC ......... *H10N 30/883* (2023.02); *H10N 30/302* (2023.02)

(58) Field of Classification Search
CPC ........ A61B 2562/182; A61B 2562/164; A61B 2562/0209; A61B 5/02444; H10N 30/302; H10N 30/883
See application file for complete search history.

(56) References Cited

U.S. PATENT DOCUMENTS 4,499,394 A * 2/1985 Koal .................... H10N 30/302
310/330
2006/0144154 A1 7/2006 Ueno et al.
2012/0055257 A1 3/2012 Shaw-Klein

FOREIGN PATENT DOCUMENTS

IT  UB20153257 A1  2/2017
KR  101322838 B1 * 10/2013 ........... H10N 30/098
(Continued)

OTHER PUBLICATIONS

International Search Report and Written Opinion for International Patent Application No. PCT/IB2020/061180, mailed Mar. 2, 2021, 11 pages.

*Primary Examiner* — J. San Martin
(74) *Attorney, Agent, or Firm* — Armstrong Teasdale LLP

(57) ABSTRACT

A flexible sensor is provided which has a flexible substrate of polymeric material, a bottom electrode layer arranged on the flexible substrate and configured to be a reference electrode, an active layer of piezoelectric material arranged on the bottom electrode layer, a top electrode layer arranged on the active layer and configured to be connected to a signal conductor, and a flexible coating layer of polymeric material that cooperates with the flexible substrate to encapsulate the (Continued)

bottom electrode layer, the active layer, and the top electrode layer. The flexible sensor has an additional layer of metal material arranged on the flexible coating layer and short-circuited to the bottom electrode layer, the additional layer and the bottom electrode layer acting as an electromagnetic shield for the flexible sensor.

4 Claims, 4 Drawing Sheets

(56) References Cited

FOREIGN PATENT DOCUMENTS

| | | | |
|---|---|---|---|
| WO | 0059049 | A1 | 10/2000 |
| WO | 2009031590 | A1 | 3/2009 |

\* cited by examiner

FLEXIBLE PIEZOELECTRIC SENSOR WITH INTEGRATED ELECTROMAGNETIC SHIELD

CROSS-REFERENCE TO RELATED APPLICATION

This application is a National Stage Application of International Patent Application No. PCT/IB2020/061180, having an International Filing Date of Nov. 26, 2020, claiming priority to Italian Patent Application No. 102019000022278, having a filing date of Nov. 27, 2019, each of which is hereby incorporated by reference in its entirety.

This invention generally relates to flexible piezoelectric devices for recording physiological parameters directly on the surface of a patient's skin.

FIELD OF THE INVENTION

In this context, there is a growing interest in the development of thin devices for recording parameters such as blood pressure, swallowing, respiratory rate, muscle activity, etc. Such devices must be flexible, very thin, lightweight, compact, and ergonomic, with the ability to capture minimal skin deformation to generate an effective signal. There are two main classes of sensors:
passive sensors, which exploit impedance variation to record a deformation variation and require adequate electronics and a power supply,
active sensors based on piezoelectric materials that directly generate a charge in response to a deformation stimulus.

BACKGROUND OF THE INVENTION

Due to their features, the sensors of the second category are of great interest; in effect, they may be used without any power supply system. In fact, in some cases it is the sensor itself that may be used to transform the kinetic and mechanical energy in the human body into electrical energy. Further, due to the properties of piezoelectric materials, there is the possibility of exploiting the technology of surface acoustic waves (SAW) to produce wireless, i.e. remotely searchable, devices.

The growing demand for wearable electronic devices that may be applied to the human body has highlighted the need to reduce signal distortions caused by the presence of electromagnetic interference (EMI), as well as by the capacitive coupling effects generated by contact with the skin. This noise contribution modifies the data acquired and influences the quality of the information provided by the signal. Further, it must be considered that movements of the skin may be almost imperceptible, inducing a generation of a very small charge on the piezoelectric sensor. It is therefore essential for the sensor to be able to perceive these microdeformations, and consequently for the signal generated not to be covered by noise. To this end, there is a great need for developing innovative, economical and integrated electromagnetic shielding solutions. Further, the design of EM shields has become increasingly challenging with the growing complexity of the electronic devices developed. Due to their high electrical conductivity, metals are traditionally the most used materials for this application. Although the use of metals in advanced multifunctional shielding solutions has some limitations (typically related to their high density which hinders the ability to obtain low weight solutions), no other material has so far achieved the same shielding effectiveness. For this reason, the need to develop thin and flexible metal films for electromagnetic shielding is widely recognized.

One of the objects of this invention is to make available a solution for integrating an electromagnetic shield into a flexible piezoelectric sensor.

SUMMARY OF THE INVENTION

For this object, the subject matter of the invention is a flexible sensor comprising
a flexible substrate made of polymeric material,
a bottom electrode arranged on the substrate and configured to be a reference electrode,
an active layer of piezoelectric material arranged on the bottom electrode,
a top electrode arranged on the active layer and configured to be connected to a signal conductor,
a flexible coating layer of polymeric material which cooperates with the substrate to encapsulate said bottom electrode, active layer, and top electrode, and
an additional layer of metal material arranged on the coating layer,
wherein the additional layer is short-circuited to the bottom electrode, said additional layer and bottom electrode acting as an electromagnetic shield for the sensor.

The invention relates to the direct integration of a very thin electromagnetic shield into the manufacturing process of an epidermal electronic sensor, without compromising the mechanical properties of the structure as a whole, but rather stabilizing the state of charge around said structure. In this way, it is possible to exploit the conductivity features of metal materials while maintaining the overall flexibility of the device.

The shielded sensor has been designed as a piezoelectric transducer, which may be manufactured using standard microfabrication techniques having the advantage of easy engineering. The sensor is developed as a heterostructure comprising the sensitive area (the core of the sensor) interposed between two electrodes working as a signal reading pin and as a reference pin respectively, and then encapsulated in a flexible polymeric matrix. An additional metal layer is then arranged on the top surface which completes the shield once it is short-circuited to the reference electrode used as the bottom connector of the electromagnetic shield.

BRIEF DESCRIPTION OF THE DRAWINGS

Further features and advantages of the sensor according to the invention will be presented in the following detailed description, which refers to the attached drawings, provided only by way of non-limiting example, wherein.

DETAILED DESCRIPTION

Figure 1:
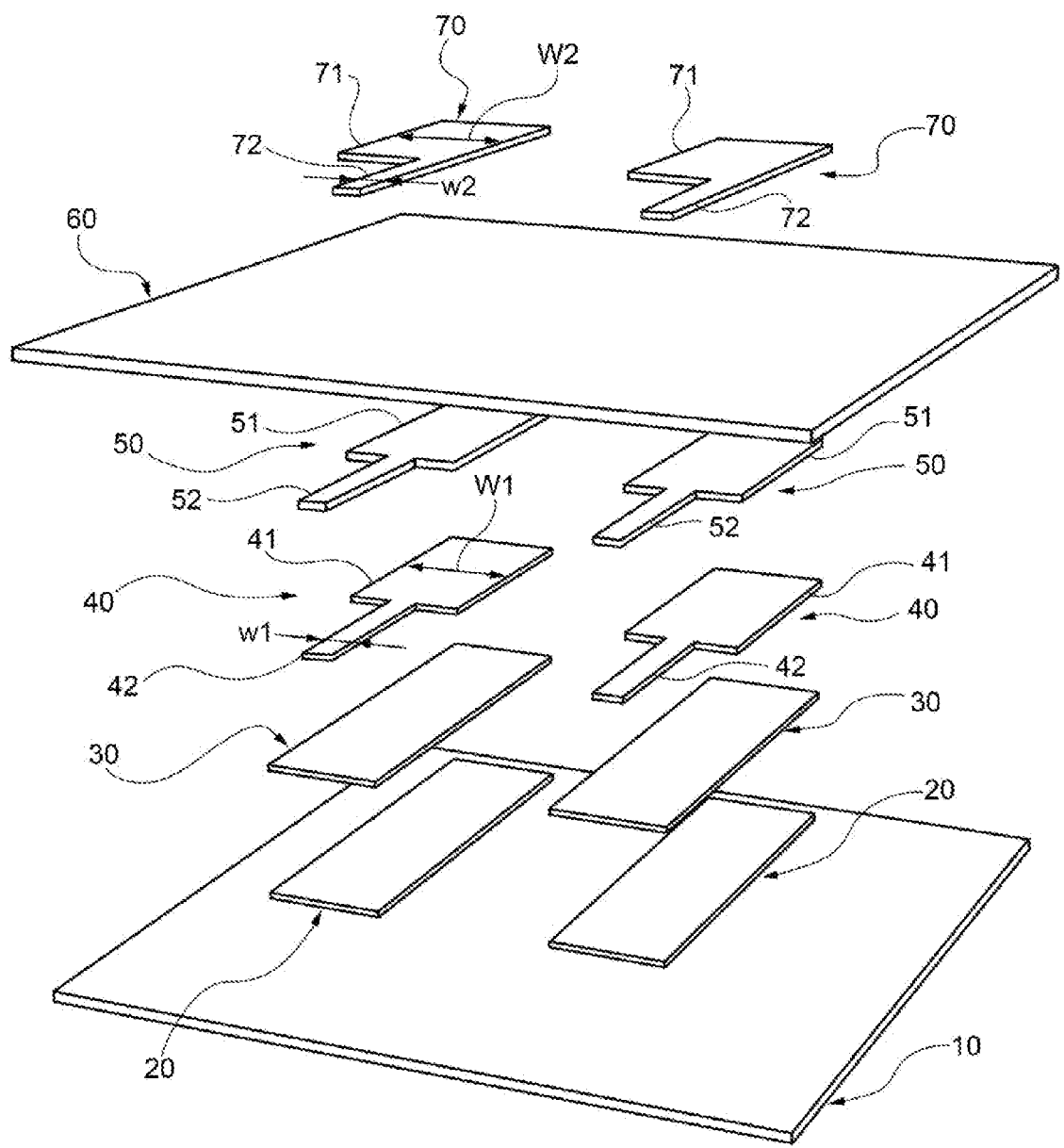
FIG. 1 is an exploded schematic view representing the manufacturing of sensors according to the invention.

With reference to FIG. 1, a manufacturing process for a shielded piezoelectric sensor according to the invention is now described. In reality, FIG. 1 shows the manufacturing of two sensors at the same time. The process described hereinafter may in effect be used for the mass production of several devices.

First, a flexible substrate 10 made of polymeric material is prepared. In particular, the substrate 10 may be made of polyimide. The key features of this class of materials include high glass transition temperature and thermal stability, low dielectric constant, chemical stability, solvent resistance, and high mechanical strength, which make the final device capable of withstanding several deformation cycles without being damaged. Due to these features, the polymer may be easily used in all the necessary manufacturing steps. For example, a commercial polyimide sheet (Kapton®) may be used as a substrate.

Subsequently, the deposition of a very thin adhesion layer 20, for example of aluminum nitride (AlN), on the substrate 10 may be envisaged. The inclusion of the adhesion layer 20 before the deposition of the metal layer of the bottom electrode allows for the mechanical stress of the thin films deposited thereon to be compensated, as well as for the crystalline structure of the active layer and the adhesion of the metal layer to be improved.

Subsequently, a bottom electrode layer 30 made of metal material, e.g. molybdenum (Mo), is deposited. For the purposes of the invention, the spatial terms "bottom" and "top" refer to the stacking direction of the various sensor layers on the substrate 20, and not necessarily to the position these layers will have during the use of the device. As will be clarified below, the bottom electrode layer 30 acts both as a reference electrode and as the first layer of an electromagnetic shield. The shape and dimensions of the bottom electrode layer 30 are designed to include the entire active area and the signal connection (active layer 40 and top electrode layer 50), achieving complete electrical shielding (see also FIG. 2).

The active layer 40 made of piezoelectric material and the top electrode layer 50 made of metal material, for example molybdenum (Mo), are then deposited. These two layers are designed with the same shape and size (in other words, geometrically congruent) so as to exploit a single deposition and microfabrication step. The active layer 40 comprises a main portion 41 and an extension 42 which extends from the main portion 41 and has a width w1 less than the width W1 of the main portion 41. The top electrode layer 50 comprises a main portion 51 superimposed on the main portion 41 of the active layer 40 and an extension 52 which extends from the main portion 51 of the top electrode layer 50 and is superimposed on the extension 42 of the active layer 40. This T shape is designed to define a suitable pin pitch, which allows for a simple connection of the electrodes.

The multilayer structure described above is encapsulated in a coating layer 60 made of flexible polymeric material, for example parylene, which acts as a substrate for depositing the second shielding layer. The coating layer 60 maintains the overall flexibility of the system and avoids short circuits between the second shielding layer and the top electrode layer.

Figure 2:
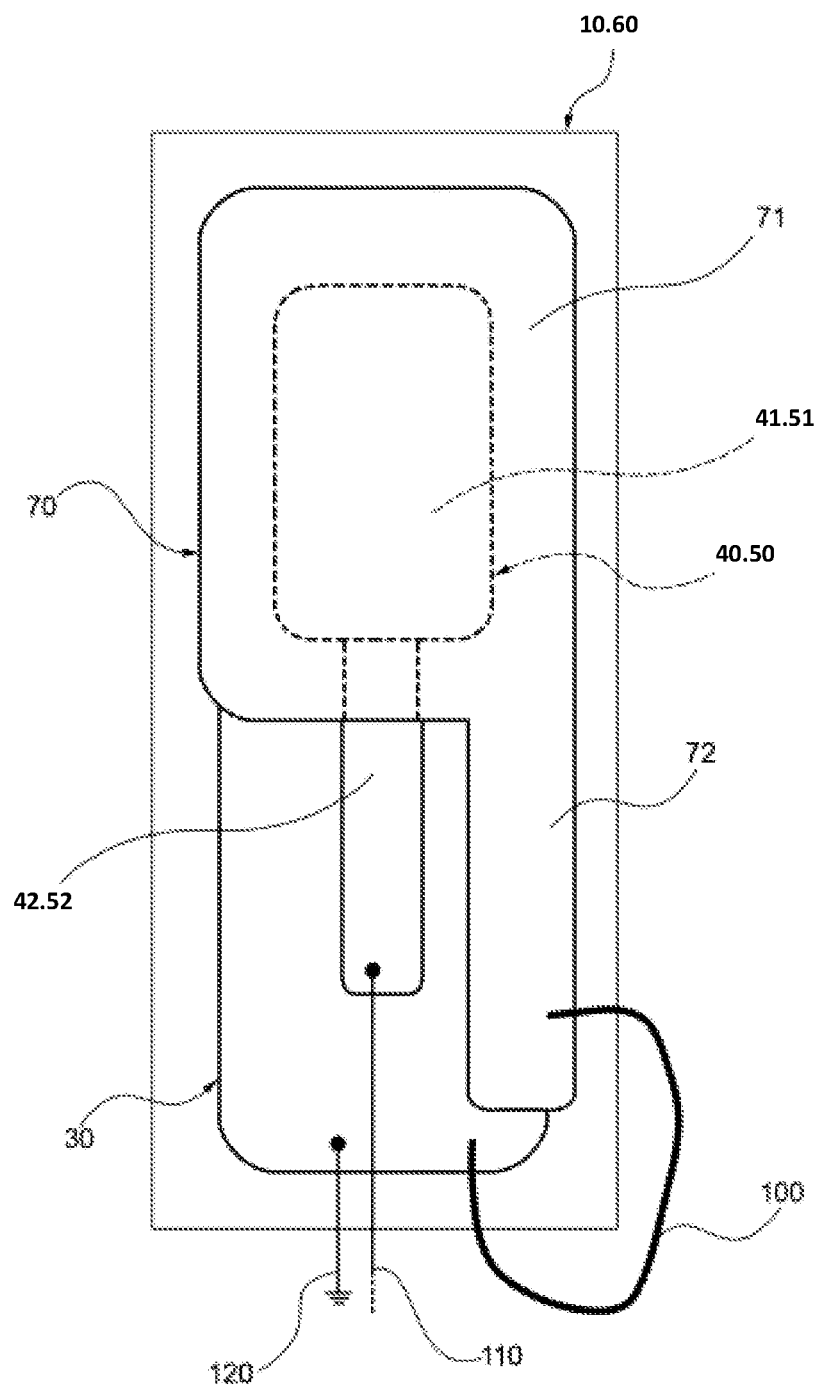
FIG. 2 is a schematic plan view of the sensor in FIG. 1.

The additional metal shielding layer 70 is then deposited on the coating layer 60. The shape of the additional metal layer 70 is designed to completely cover the sensitive area (main portions 41 and 51 of the active layer 40 and of the top electrode layer 50, respectively), and with a pin that may be easily connected to the reference electrode 30 so as to complete the shielding effect of the entire structure. In this regard, the additional metal layer 70 comprises a main portion 71 and an extension 72 which extends from the main portion 71 and has a width w2 less than the width W2 of the main portion 71. The extension 72 of the additional layer 70 is superimposed on the bottom electrode 30 and not superimposed on the active layer and top electrode 40, 50 (see also FIG. 2). The two parts of the electromagnetic shield, i.e. the additional layer 70 and the bottom electrode layer 30, are short-circuited through the use of a rigid or flexible printed circuit board (PCB), or other known methods, as represented by the conductor 100 schematically represented in FIG. 2. FIG. 2 also schematically represents a signal connection 110 connected to the top electrode layer 50, and a reference connection 120 connected to the bottom electrode layer 30. As stated above, since the bottom electrode layer 30 is short-circuited to the additional layer 70, the entire shield formed of these two layers is connected to the reference.

The plan view of FIG. 2 also shows that the active layer 40 and the top electrode 50 are superimposed and enclosed within the perimeter of the bottom electrode 30, and that the main portions 41, 51 of the active layer 40 and the top electrode 50 are enclosed within the perimeter of the main portion 71 of the additional layer 70. Further, the extension 72 of the additional shielding layer 70 is superimposed on the bottom electrode 30 and not superimposed on the active layer 40 and the top electrode 50.

All the materials, the thickness of the individual layers, their dimensions and geometries are designed in such a way as to maintain the overall flexibility and lightness of the device, while providing a perfect insulation from environmental noise and from the injection of capacitive coupling. Further, the entire manufacturing process may be based on standard microfabrication techniques, including photolithography, material deposition and etching, with the advantage of simple engineering for the different manufacturing steps.

Some prototypes were made according to the example described hereinafter.

The sensor is manufactured starting from an Si wafer which forms the rigid support where a polymeric substrate is laminated through the use of an adhesive layer of PDMS (Sylgard 184) which acts as a glue. The PDMS is then cured to allow the substrate to attach to the silicon wafer. A 25 μm thick Kapton® (DuPont) film is used as a substrate for the deposition of the multilayer structure composed of a sequence of:

AlN interlayer (120 nm thick), as a template for the deposition of subsequent layers;

first layer of Mo (200 nm thick) which acts as a reference electrode for the signal and shield electrodes;

piezoelectric layer made of AlN (1000 nm) which is deposited as a thin film with good piezoelectric properties directly on the first Mo layer. This material has piezoelectric features without additional electrical poling or annealing treatments;

second layer of Mo (200 nm thick), used as a signal electrode for collecting the generated electrical signal;

parylene C as the insulating interlayer on which the top shielding electrode is manufactured;

Cr/Mo layer as top shielding electrode (400 nm thick). An adhesion layer made of Cr is deposited with a thickness of 10 nm, promoting the adhesion of the Mo film on the parylene substrate.

All the layers are deposited by sputtering techniques in three distinct steps so as to simplify the patterning process. The reference electrode and interlayer are deposited directly on the Kapton substrate during the first deposition step. The AN interlayer is deposited by sputtering using a high purity Al target (99.9995%) with a gaseous mixture of $N_2$ and Ar at 20 sccm and a pressure of $2.8 \times 10^{-3}$ mbar, under direct current (DC) pulsed at 750 W with a frequency of 100 kHz. Mo layers are deposited by sputtering using a pure Mo target (99.95%) in an Ar atmosphere (66 sccm) under direct current at a power of 200 W and a working pressure of $5 \times 10^{-3}$ mbar. A rectangular pattern is imparted to these two layers through the use of standard microfabrication techniques including optical photolithography and dry etching. In particular, dry etching is carried out using inductive plasma etching equipment (ICP) with a plasma made of a mixture of $BCl_3$ and Ar to selectively erode these two materials.

Subsequently, in a second manufacturing step the active layer and the top electrode of AlN and Mo are deposited with a thickness of 1 μm. AlN is deposited by sputtering using the same target and the same gas mixture as the interlayer and applying a direct current at 1000 W and 100 kHz. These deposition parameters allow a high quality piezoelectric material AlN to be obtained with grain orientation along the c axis. The top Mo electrode is deposited and shaped according to a pattern using the same conditions as the bottom electrode. The same $BCl_3$/Ar-based gas mixture is used to impart a pattern to the piezoelectric layer.

At this point, the device is encapsulated in a parylene layer with a thickness of ~1 μm so as to avoid short circuits between the signal electrode and the top shielding electrode which is then added to the heterostructure. The electrical shielding is manufactured using a lift-off process. A thin chromium layer (10 nm) is added through the use of a thermal evaporator, before the deposition of Mo, to improve the adhesion between the metal and the parylene layer, and to avoid the formation of cracks on the surface of the top shielding electrode. Lastly, a layer of Mo 400 nm thick is deposited, leaving the metallization sputtering conditions unchanged. In this way it is possible to obtain a perfectly homogeneous and smooth surface, without defects or discontinuities, which improves the quality of the shielding effect.

An $O_2$-based ICP-RIE technique is used to open vertical interconnection accesses to the contact pads for the bottom electrode and the signal electrode. Finally, the device is detached from the support by peeling it from the sacrificial layer of PDMS. To obtain the shielding, it is necessary to short-circuit the top shielding electrode and the bottom electrode. To this end, different techniques may be used, depending on the application and project specifications, such as: PCB (properly designed), conductive inks, glues or pastes, additional metallization, conductive adhesive tape.

Proof of Concept

A prototype of the device has been developed and tested in the laboratory. For this proof of concept, different sensors were produced (as described below) so as to quantify the performance of the shielding in terms of rejecting external noise:

"Shield" (or S1): is a shielded piezoelectric sensor with an active area of 4 mm×5 mm and a shield of 6 mm×7 mm;

"No_shield" (or S2): is a sensor without a shield with the same active area as Shield;

"Shield_P" (or S1_P): is a sensor with the same features as Shield but with an additional layer of parylene to better insulate the system from external noise, e.g. from power line interference. In this case the only noise that may be injected is by capacitive coupling, caused by contact with different parts of the structure;

"No_shield_P" (or S2_P): sensor with the same features as No_shield and with the additional insulating layer of parylene;

a commercial piezoelectric sensor was used as a reference for comparison (Murata).

The reference electrode of the sensor and the ES are circuited with the use of an ad hoc printed circuit board, while the signal is picked up by a dedicated connection pin. The sensors were alternately connected to the same charge amplifier and noise evaluations were made from the acquired signal by an oscilloscope (Tektronix, MDO4000). Different types of measurements were performed. Signals were recorded for 4 seconds under all test conditions for all sensors, and variances were calculated and reported to quantify the noise power.

Figure 3:
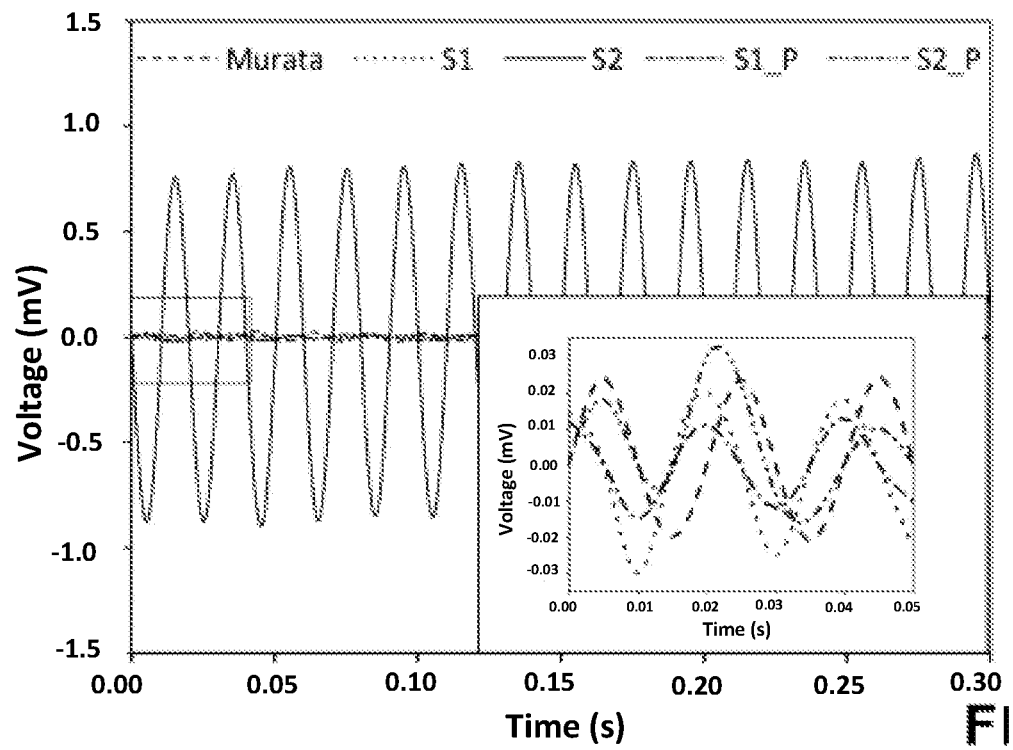
FIG. 3 is a graph showing a qualitative analysis of the noise injection in different sensors.

Comparison of the Noise Generated by the Single Sensors without Contact with the Skin The first measurement is carried out simply by placing the sensors on a test bench, without any contact with the skin. In this first experiment, no deformations or stimuli are applied so as to quantify the noise power due only to the presence of environmental interference. The results are shown in FIG. 3. Qualitatively, it is quite evident that the signal coming from the flexible sensor without any insulation system (solid line) is characterized by the highest residual noise, as expected. In all other cases, the noise power has been significantly reduced and is comparable to Murata's commercial piezoelectric sensor, taken as a reference. The results of the quantitative analysis are reported in Table 1 below.

TABLE 1

| Sensor | Noise power ($V^2$) |
| --- | --- |
| Murata | $7.0\ e^{-14}$ |
| Shield | $8.3\ e^{-14}$ |
| No_shield | $2.9\ e^{-11}$ |
| Shield_P | $7.0\ e^{-14}$ |
| No_shield_P | $9.5\ e^{-14}$ |

In particular, it may be observed that, unlike the No_shield sensor, in all the other devices tested the noise power is reduced by about two orders of magnitude. In both cases (with or without the additional deposition of parylene) it may be observed that the presence of the metal shield layer provides improved protection against noise induction. In effect, the noise power is lower in both Shield and Shield_P compared to No_shield_P in which the only insulation is provided by the parylene layer. Further, as reported above, the shielding effect is more evident in reducing the noise from capacitive coupling, due to contact with the skin, while the parylene coating is sufficient to repel only the power line interference present on the sensor. This is the reason why in this case the difference is not very significant, due to the absence of an induced capacitive coupling in this measurement set-up.

Figure 4:
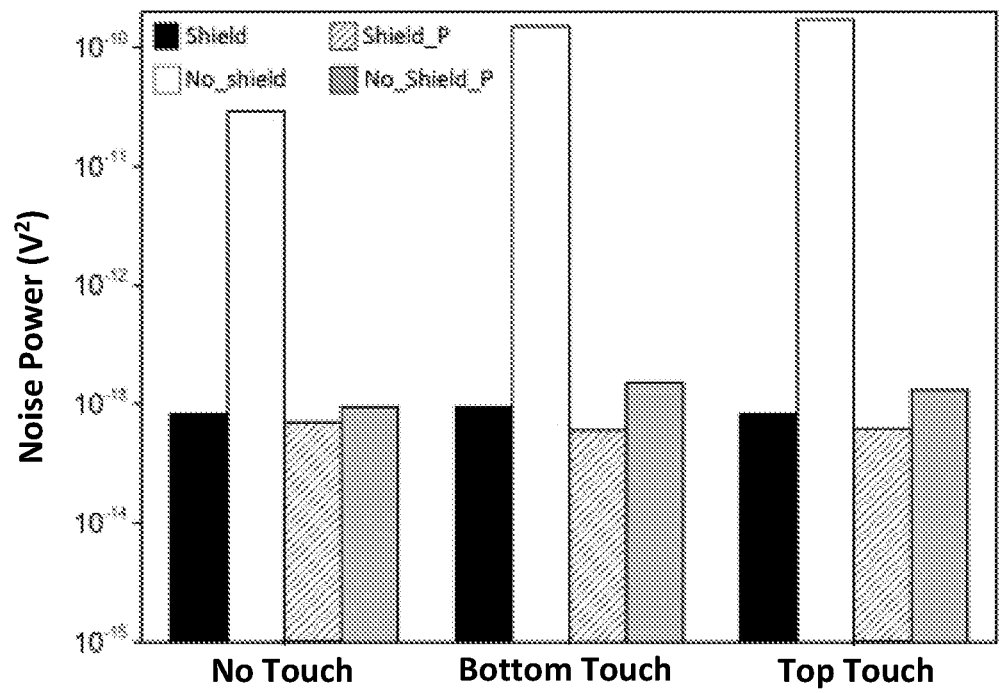
FIG. 4 is a graph showing a comparison between the noise powers of different sensors and in different conditions.

Comparison of the Noise Generated in Different Stationary Conditions, Inducing a Capacitive Coupling Between the Sensor and the Skin The second measurement set-up was designed to test the injection of a capacitive coupling noise on the sensors by placing these sensors in direct contact with the skin. The flexible devices, placed again on the test bench, were touched during the acquisition of the signal alternately on their top part and on their bottom part, taking care not to induce any stimulus on the sensor. The quantitative analysis is reported in the following table 2 and represented in the histogram of FIG. 4.

TABLE 2

| Sensor | No-touch noise power ($V^2$) | Bottom touch noise power ($V^2$) | Top touch noise power ($V^2$) |
|---|---|---|---|
| Shield | 8.3 $e^{-14}$ | 9.5 $e^{-14}$ | 8.54 $e^{-14}$ |
| No_shield | 2.9 $e^{-11}$ | 1.5 $e^{-10}$ | 1.7 $e^{-10}$ |
| Shield_P | 7.0 $e^{-14}$ | 8.03 $e^{-14}$ | 8.2 $e^{-14}$ |
| No_shield_P | 9.5 $e^{-14}$ | 1.5 $e^{-13}$ | 1.3 $e^{-13}$ |

The measurements show that in the case of the Shield and Shield_P sensors the injection of a capacitive coupling noise does not cause any change in the noise power, which remains unchanged compared to the first measurement in which the sensor was not in contact with the skin. These results demonstrate the ability of the thin metal shield to completely shield the sensor from the induced capacitive noise.

Further, for the unshielded No_shield and No_shield_P sensors, the capacitive coupling noise injection creates an increase in noise power which is approximately 5 times greater for No_shield compared to the non-touch case, and approximately doubled for No_shield_P. As expected, the coating of parylene alone is not sufficient to shield the sensor from the noise induced by a capacitive coupling, and in this regard it has been verified that for both shielded sensors the residual noise is at least half compared to No_Shield_P. Lastly, it is possible to observe that for Shield_P the action of the polymeric coating provides a small additional contribution to noise rejection by decreasing the power values by about 0.9 times in the worst case, compared to Shield.

Proof of Concept Study on Measuring Noise Rejection on the Skin

Figure 5:
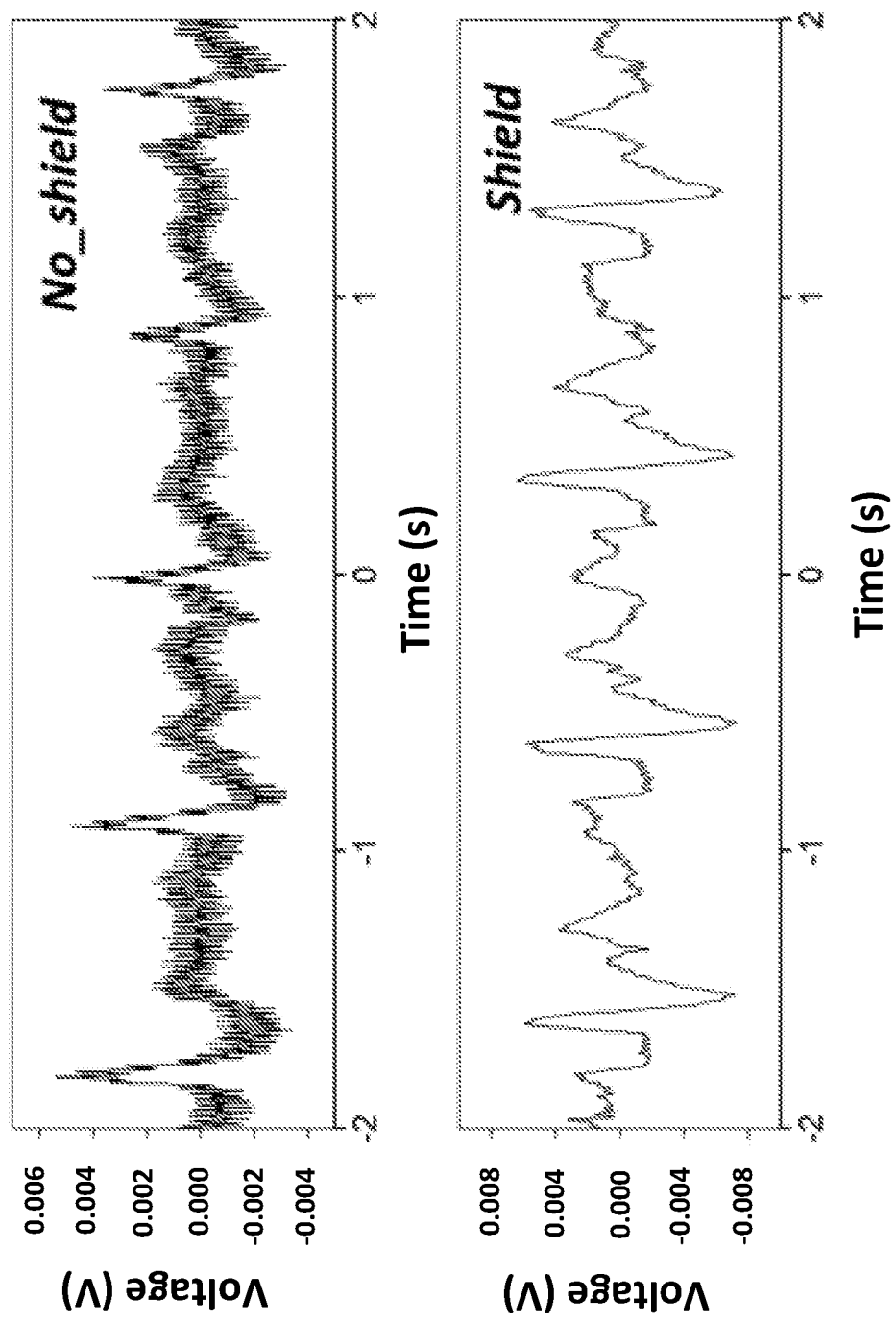
FIG. 5 is a graph showing a comparison between the signal acquired by different sensors at the carotid artery on the neck of a patient.

A proof-of-concept study on the evaluation of the signal-to-noise ratio of sensors was carried out. In this case only Shield_P and No_shield_P were used for the test. They were mounted on the patient's neck at the carotid artery, in order to record the small movement of the skin due to the flow in the blood vessel. As may be seen in the graph in FIG. 5, the signal recorded by No_shield_P is covered by the noise derived from the capacitive coupling between the sensor and the skin (as reported above, parylene cuts the fraction of noise due to the environment and to the line power). Considering the signal as a deterministic variable and the noise as a random signal with zero mean, the signal-to-noise ratio may be defined as follows:

$$SNR = \frac{\bar{s}^2(t)}{\Delta n^2}$$

where $\bar{s}(t)$ is the mean of the signal, and $\Delta n^2$ is the variance of the noise. SNR is expressed in decibels. In this case the calculated values for the two recorded signals are summarized in Table 3; the mean of the signal is considered the same for both cases, and the noise power is reported as the noise variance.

TABLE 3

| Variance Shield_P | 1.0 $e^{-13}$ |
|---|---|
| Variance No_shield_P | 4.5 $e^{-13}$ |
| Quadratic mean signal | 3.6 $e^{-9}$ |

The calculated values are comparable to those reported above in the case of contact with the skin at the bottom part of the sensor. Using the above equation, for No_shield_P the calculated SNR is about 39.5 dB, while the shielded sensor has an SNR value that is about 45 dB, again highlighting the importance of the presence of the shield in terms of rejection of the capacitive coupling noise.

What is claimed is:

1. A flexible sensor comprising
a flexible substrate of polymeric material,
a bottom electrode layer arranged on the flexible substrate and configured to be a reference electrode,
an active layer of piezoelectric material arranged on the bottom electrode layer,
a top electrode layer arranged on the active layer and configured to be connected to a signal conductor, and
a flexible coating layer of polymeric material cooperating with the flexible substrate to encapsulate said bottom electrode layer, active layer and top electrode layer,
said flexible sensor further comprising an additional layer of metal material arranged on the flexible coating layer and short-circuited to the bottom electrode layer, said additional layer and bottom electrode layer acting as electromagnetic shield for the flexible sensor,
wherein the active layer comprises a main portion and an extension extending from the main portion and having a width less than the width of the main portion,
wherein the top electrode layer comprises a main portion overlapping the main portion of the active layer and an extension overlapping the extension of the active layer, and
wherein said active layer and top electrode layer are geometrically congruent.

2. The flexible sensor of claim 1, wherein, when viewed in plan view, said active layer and top electrode layer are enclosed within a perimeter of the bottom electrode layer.

3. The flexible sensor of claim 2, wherein the additional layer comprises a main portion and an extension extending from the main portion, the extension of the additional layer overlapping the bottom electrode layer and non-overlapping said active layer and top electrode layer.

4. The flexible sensor of claim 3 wherein, when viewed in plan view, the main portions of said active layer and top electrode layer are enclosed within the perimeter of the main portion of the additional layer.

* * * * *